(12) United States Patent
Lee et al.

(10) Patent No.: US 9,287,161 B2
(45) Date of Patent: Mar. 15, 2016

(54) METHOD OF FORMING WIRINGS (71) Applicant: SAMSUNG ELECTRONICS CO., LTD., Suwon-si, Gyeonggi-do (KR)

(72) Inventors: Sang-Hyun Lee, Seoul (KR); Myeong-Cheol Kim, Suwon-si (KR); Yoo-Jung Lee, Hwaseong-si (KR); Il-Sup Kim, Suwon-si (KR); Seung-Ju Park, Boryeong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/497,501

(22) Filed: Sep. 26, 2014

(65) Prior Publication Data
US 2015/0140810 A1 May 21, 2015

(30) Foreign Application Priority Data
Nov. 21, 2013 (KR) .......................... 10-2013-0145696

(51) Int. Cl.
H01L 21/768 (2006.01)
H01L 21/311 (2006.01)

(52) U.S. Cl.
CPC .... H01L 21/76802 (2013.01); H01L 21/31144 (2013.01); H01L 21/76877 (2013.01)

(58) Field of Classification Search
CPC ................ H01L 21/311; H01L 21/768; H01L 21/76802; H01L 21/76877; H01L 21/31144; H01L 21/00; H01L 21/60; H01L 21/8239; H01L 23/538; H01L 23/5384; H01L 23/48
USPC ......... 438/666, 424, 427, 629, 637, 638, 639, 438/672, 675, 689, 700
See application file for complete search history.

(56) References Cited

U.S. PATENT DOCUMENTS

| 6,987,322 | B2 | 1/2006 | Chen et al. | |
| 7,365,009 | B2 | 4/2008 | Chou et al. | |
| 7,807,582 | B2 | 10/2010 | Doebler | |
| 7,902,539 | B2 | 3/2011 | Moniwa et al. | |
| 8,652,763 | B2 * | 2/2014 | Jain | H01L 21/0277 430/314 |
| 2006/0151888 | A1 * | 7/2006 | Kurashima | H01L 21/76832 257/774 |
| 2007/0105241 | A1 * | 5/2007 | Leuschner | H01L 21/76852 438/3 |
| 2012/0187504 | A1 | 7/2012 | Igarashi et al. | |
| 2012/0248609 | A1 * | 10/2012 | Tomita | H01L 21/76804 257/751 |
| 2013/0341793 | A1 * | 12/2013 | Suzumura | H01L 23/5384 257/751 |
| 2014/0134404 | A1 * | 5/2014 | Jain | H01L 21/0277 428/172 |

FOREIGN PATENT DOCUMENTS

| KR | 10-2002-0031493 A | 5/2002 |
| KR | 10-2004-008-574 A | 9/2004 |
| KR | 10-2005-0002074 A | 1/2005 |
| KR | 10-2010-0026223 A | 3/2010 |
| KR | 10-2013-0023747 A | 3/2013 |

* cited by examiner

Primary Examiner — Chuong A Luu
(74) Attorney, Agent, or Firm — Lee & Morse, P.C.

(57) ABSTRACT

A method of manufacturing a wiring includes sequentially forming a first insulation layer, a first layer, and a second layer on a substrate, etching an upper portion of the second layer a plurality of times to form a second layer pattern including a first recess having a shape of a staircase, etching a portion of the second layer pattern and a portion of the first layer under the first recess to form a first layer pattern including a second recess having a shape of a staircase similar to the first recess, etching a portion of the first layer pattern under the second recess to form a first opening exposing a portion of a top surface of the first insulation layer, etching the exposed portion of the first insulation layer to form a second opening through the first insulation layer, and forming a wiring filling the second opening.

20 Claims, 13 Drawing Sheets

METHOD OF FORMING WIRINGS

CROSS-REFERENCE TO RELATED APPLICATION

Korean Patent Application No. 10-2013-0145696, filed on Nov. 21, 2013, in the Korean Intellectual Property Office, and entitled: "Method Of Forming Wirings," is incorporated by reference herein in its entirety.

BACKGROUND

Example embodiments relate to a method of forming wirings. More particularly, example embodiments relate to a method of forming wirings contacting two contact plugs.

SUMMARY

Embodiments are directed to a method of manufacturing a wiring including sequentially forming a first insulation layer, a first layer, and a second layer on a substrate, etching an upper portion of the second layer a plurality of times to form a second layer pattern including a first recess having a shape of a staircase in which a center portion is relatively low, etching a portion of the second layer pattern and a portion of the first layer under the first recess to form a first layer pattern including a second recess having a shape of a staircase similar to that of the first recess, etching a portion of the first layer pattern under the second recess until a top surface of the first insulation layer is exposed to form a first opening exposing a portion of the first insulation layer, etching the exposed portion of the first insulation layer to form a second opening through the first insulation layer, and forming a wiring filling the second opening.

The first layer may be formed to have a thickness greater than that of the second layer. The first layer may be formed using a material having an etch rate higher than that of the second layer.

The first layer may be formed to include a spin on hardmask. The second layer may be formed of an oxide by an atomic layer deposition process.

The first layer may be formed to include a material having a high etch selectivity with respect to the first insulation layer.

The first layer may be formed to include a spin on hardmask. The first insulation layer may be formed to include silicon oxide.

The method may further include, before forming the first insulation layer and the first and second layers, forming an insulating interlayer on the substrate, and forming a first contact plug and a second contact plug through the insulating interlayer on the substrate. The wiring may be formed to contact top surfaces of the first and second contact plugs.

Forming the second layer pattern may include etching the second layer twice to form the second layer pattern including the first recess having the shape of a staircase. A portion of the first recess vertically overlapping a portion of the insulating interlayer between the first and second contact plugs may be formed to be lower than a portion of the first recess vertically overlapping the first contact plug or the second contact plug.

Forming the second layer pattern may include etching a portion of the second layer vertically overlapping the first contact plug and a portion of the second layer vertically overlapping a portion of the insulating interlayer between the first and second contact plugs, and etching a portion of the second layer vertically overlapping the second contact plug and an additional portion of the second layer vertically overlapping a portion of the insulating interlayer between the first and second contact plugs.

Etching the upper portion of the second layer the plurality of times to form the second layer pattern may include forming a first mask layer structure on the second layer, partially etching the first mask layer structure, and performing a first etching process on the second layer using the etched first mask layer structure.

Forming the first mask layer structure may include sequentially forming first to third mask layers on the second layer.

The first to third mask layers may respectively include silicon nitride, spin on hardmask and silicon oxynitride.

Etching the upper portion of the second layer the plurality of times to form the second layer pattern may further include, after performing the first etching process on the second layer, performing a second etching process on the second layer using a second mask layer structure.

The second mask layer structure may include a fourth mask including a silicon hardmask and a fifth mask including silicon oxynitride.

Forming the first opening may include removing a portion of the second layer pattern under the second recess.

Etching the upper portion of the second layer a plurality of times may include performing a wet etch process.

Embodiments are also directed to a method of manufacturing a wiring including providing a gate structure on a substrate, providing an insulating interlayer covering the gate structure, and providing a first contact plug and a second contact plug extending through the insulating interlayer and contacting first and second impurity regions in the substrate adjacent to the gate structure, the first and second contact plugs being exposed at a top surface of the insulating interlayer, sequentially forming a first insulation layer, a first layer, and a second layer on the top surface of the insulating interlayer, the first layer having a higher etch rate than the second layer and having a high etch selectivity with respect to the first insulation layer, etching an upper portion of the second layer a plurality of times to form a second layer pattern including a first recess having a tiered shape such that a portion of the first recess vertically overlapping a portion of the insulating interlayer between the first and second contact plugs is lower than a portion of the first recess vertically overlapping the first contact plug or the second contact plug, etching a portion of the second layer pattern and a portion of the first layer under the first recess to form a first layer pattern including a second recess having a tiered shape such that a portion of the second recess vertically overlapping a portion of the insulating interlayer between the first and second contact plugs is lower than a portion of the second recess vertically overlapping the first contact plug or the second contact plug, etching a portion of the first layer pattern under the second recess to form a first opening exposing a portion of the first insulation layer, etching the exposed portion of the first insulation layer to form a second opening exposing the top surface of the insulating interlayer and the first and second contact plugs and not exposing the gate structure, and forming a wiring filling the second opening, the wiring contacting top surfaces of the first and second contact plugs and being insulated from the gate structure.

The first layer may have a thickness greater than that of the second layer.

The first layer may be a spin on hardmask or an amorphous carbon layer. The second layer may include an insulating material including an oxide by an atomic layer deposition process.

The first layer may be a spin on hardmask. The first insulating layer may be formed of silicon oxide.

Etching the upper portion of the second layer a plurality of times may include performing a wet etch process

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings thereof.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope thereof.

Unless otherwise defined, all terms (including technical and scientific terms) used herein have the same meaning as commonly understood by one of ordinary skill in the pertinent art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1:
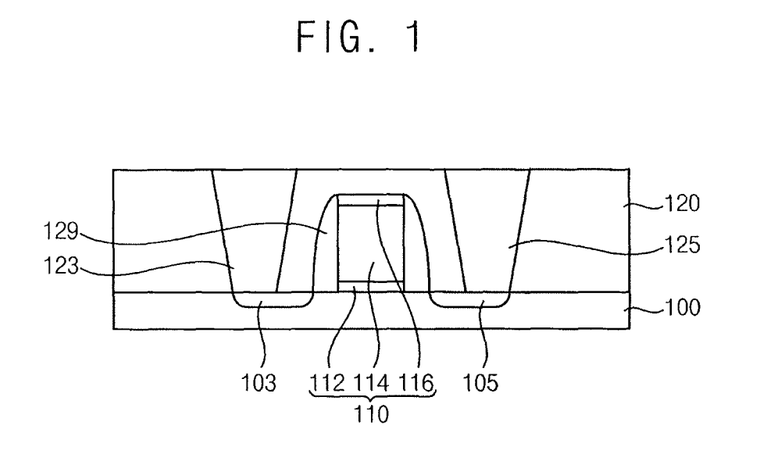
FIGS. 1 to 15 illustrate cross-sectional views depicting stages of a method of manufacturing a wiring in accordance with example embodiments.

FIGS. 1 to 15 illustrate cross-sectional views depicting stages of a method of manufacturing a wiring in accordance with example embodiments Referring to FIG. 1, a gate structure 110 may be formed on a substrate 100.

The substrate 100 may be a silicon substrate, a germanium substrate, a silicon-germanium substrate, a silicon-on-insulator (SOI) substrate, a germanium-on-insulator (GOI) substrate, etc.

In example embodiments, a gate insulation layer, a gate electrode layer and a gate mask layer may be sequentially formed on the substrate 100, and may be etched by a photolithography process to form a gate structure 110 including a gate insulation layer pattern 112, a gate electrode 114 and a gate mask 116 sequentially stacked on the substrate 100. The gate insulation layer may include, e.g., silicon oxide or a metal oxide, the gate electrode layer may include, e.g., a doped polysilicon or a metal, and the gate mask layer may include, e.g., silicon nitride.

A spacer 129 may be formed on sidewalls of the gate structure 110, and a first impurity region 103 and a second impurity region 105 may be formed at upper portions of the substrate 100 adjacent the gate structure 110, respectively.

To form the spacer 129, a spacer layer may be formed on the substrate 100 to cover the gate structure 110. The spacer layer may be anisotropically etched to form the spacer 129. The spacer layer may include, e.g., silicon nitride. An ion implantation process may be performed on the substrate 100 using the gate structure 110 and the spacer 129 as an ion implantation mask to form the first and second impurity regions 103 and 105. P-type impurities or n-type impurities may be implanted into the upper portions of the substrate 100 to form the first and second impurity regions 103 and 105.

A first insulating interlayer 120 may be formed on the substrate 100 to cover the gate structure 110 and the spacer 129.

The first insulating interlayer 120 may be formed using an oxide such as phosphor silicate glass (PSG), boro-phosphor silicate glass (BPSG), undoped silicate glass (USG), tetra ethyl ortho silicate (TEOS), plasma enhanced-TEOS (PE-TEOS) or high density plasma-chemical vapor deposition (HDP-CVD) oxide. The first insulating interlayer 120 may be formed by a chemical vapor deposition (CVD) process, a plasma enhanced chemical vapor deposition (PECVD) process, a spin coating process, an HDP-CVD process, etc.

Holes may be formed through the first insulating interlayer 120 to expose top surfaces of the first and second impurity regions 103 and 105 of the substrate 100. A conductive layer may be formed on the exposed top surfaces of the first and second impurity regions 103 and 105 and the insulating interlayer 120. An upper portion of the conductive layer may be planarized to form a first contact plug 123 and a second contact plug 125. The first and second contact plugs 123 and 125 may directly contact the top surfaces of the first and second impurity regions 103 and 105, respectively. The conductive layer may be formed to include, e.g., a doped polysilicon, a metal, etc. The planarization process may be performed to expose a top surface of the first insulating interlayer 120 by an etch back process and/or a chemical mechanical polishing (CMP) process.

Figure 2:
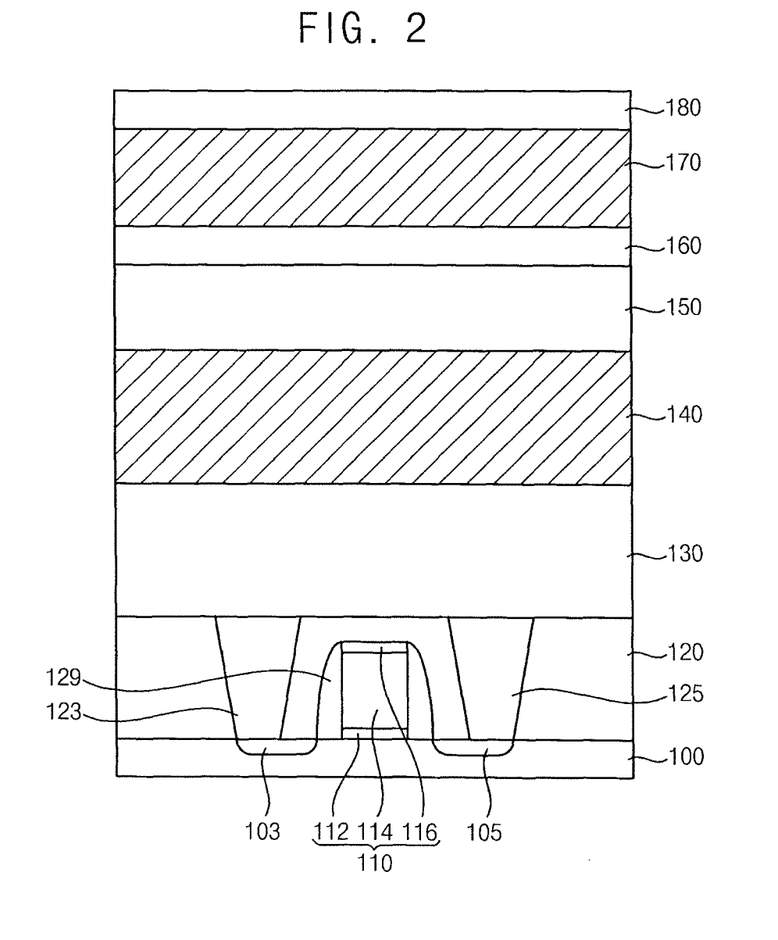

Referring to FIG. 2, a second insulating interlayer 130, a first layer 140, a second layer 150, a first mask layer 160, a second mask layer 170 and a third mask layer 180 may be sequentially formed on the first insulating interlayer 120 and the first and second contact plugs 123 and 125. The first mask layer 160, the second mask layer 170 and the third mask layer 180 may serve as a first mask layer structure. In an example embodiment, prior to forming the second insulating interlayer 130, an etch stop layer may be further formed on the first insulating interlayer 120 and the first and second contact plugs 123 and 125 using a material such as silicon nitride, silicon carbonitride, etc.

The second insulating interlayer 130 may include an insulating material containing, e.g., an oxide, a nitride, etc. The first layer 140 may include a soft material that may be rapidly etched. For example, the first layer 140 may include a spin on hardmask (SOH) or an amorphous carbon layer (ACL). The second layer 150 may include a hard material that may be slowly etched. For example, an atomic layer deposition (ALD) process may be performed to form the second layer 150 using silicon oxide. In example embodiments, the first layer 140 may be formed to have a thickness greater than that of the second layer 150.

The first mask layer 160 may include, for example, silicon nitride. The second mask layer 170 may include a material having an etch selectivity with respect to a material, such as silicon nitride, of the first mask layer 160. For example, the second mask layer 170 may include, for example, SOH or ACL. In an example embodiment, the second mask layer 170 may be formed to have a thickness greater than that of the first mask layer 160. The third mask layer 170 may be formed to include, for example, silicon oxynitride.

Figure 3:
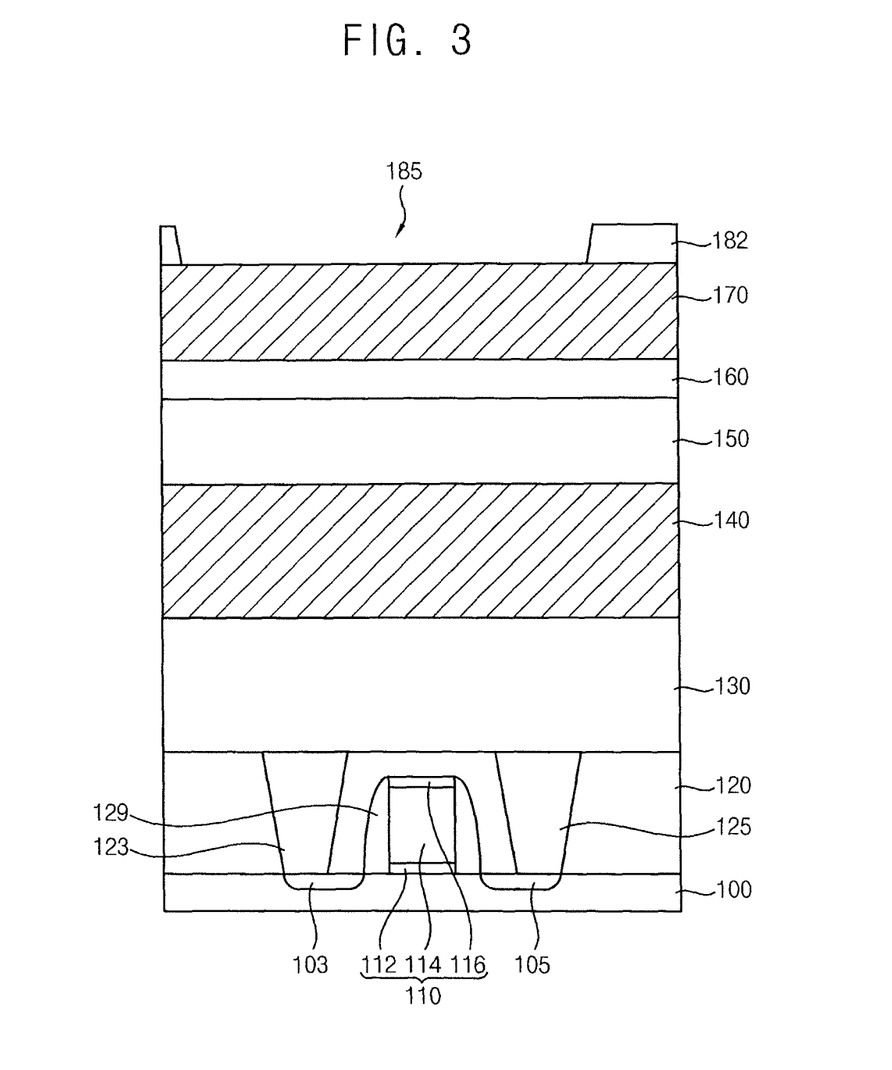

Referring to FIG. 3, a photoresist layer may be formed on the third mask layer 180, and patterned to form a photoresist pattern. The third mask layer 180 may serve as an anti-reflective layer in the patterning process.

The third mask layer 180 may be partially etched using the photoresist pattern as an etch mask to form a third mask 182. The third mask 182 may be formed to have a first opening 185 vertically overlapping the first contact plug 123 and the gate structure 110 adjacent to the first contact plug. A portion of the second mask 170 may be exposed. The photoresist pattern may be removed by an ashing and/or a stripping process.

Figure 4:
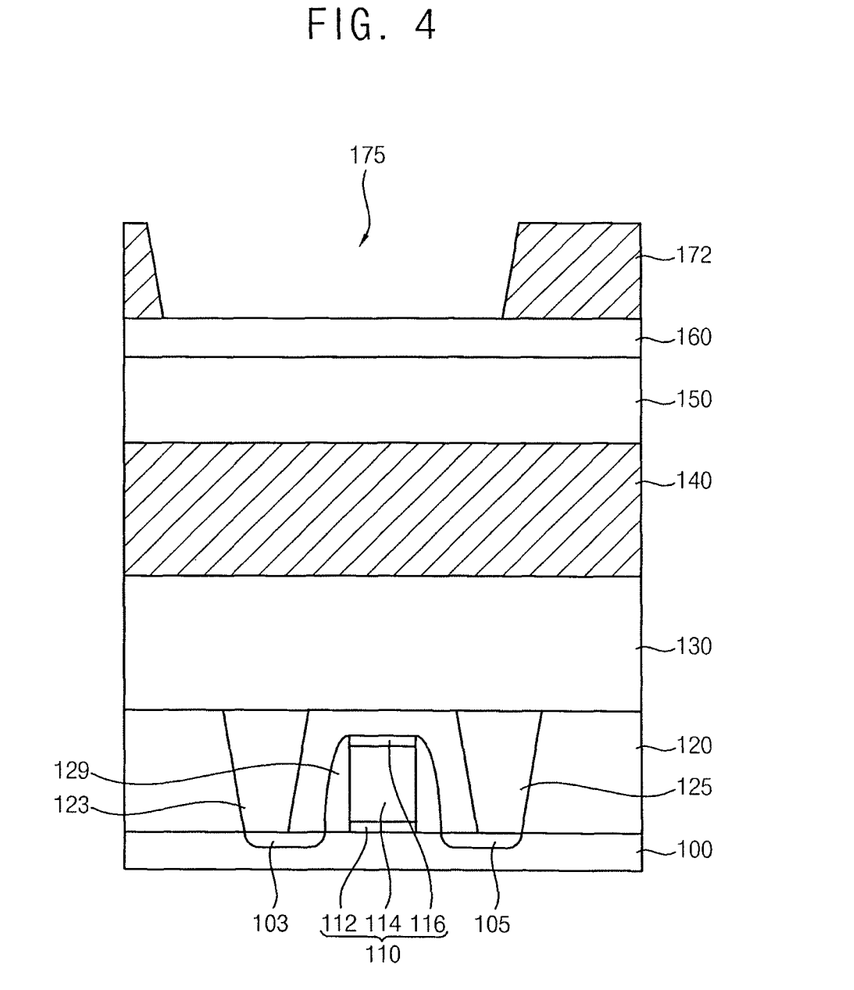

Referring to FIG. 4, the exposed portion of the second mask layer 170 may be etched using the third mask 182 as an etch mask to form a second mask 172. A second opening 175 exposing a portion of the first mask layer 160 may be formed. In the etching process, the third mask 182 may be removed.

Figure 5:
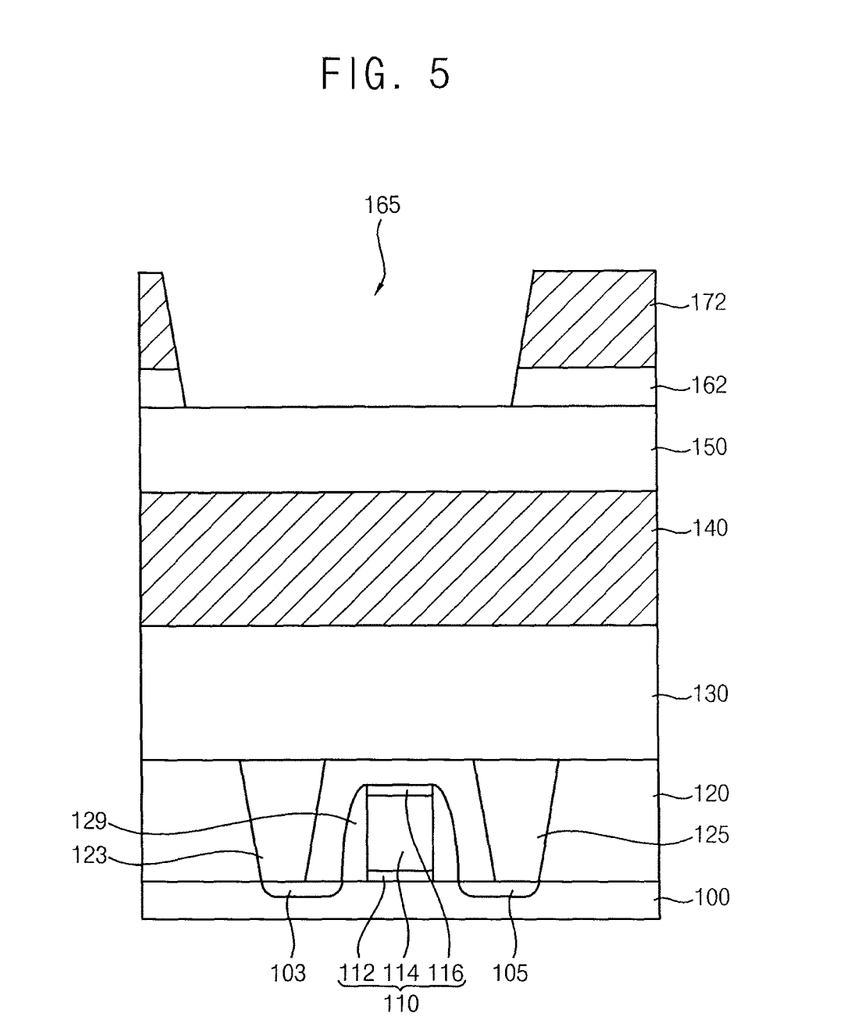

The second mask 172 may be formed to have a thickness greater than the first mask layer 160 so as to cover a first preliminary mask 162 in a subsequent process (refer to FIG. 5). The second mask 172 may prevent a damage to the first preliminary mask 162 when the second layer 150 under the first preliminary mask layer 162 is etched using the first preliminary mask 162 as an etch mask (refer to FIG. 6).

Referring to FIG. 5, the exposed portion of the first mask layer 160 may be etched using the second mask 172 as an etch mask to form the first preliminary mask 162. A third opening 165 may be formed to expose a portion of the second layer 150.

Figure 6:
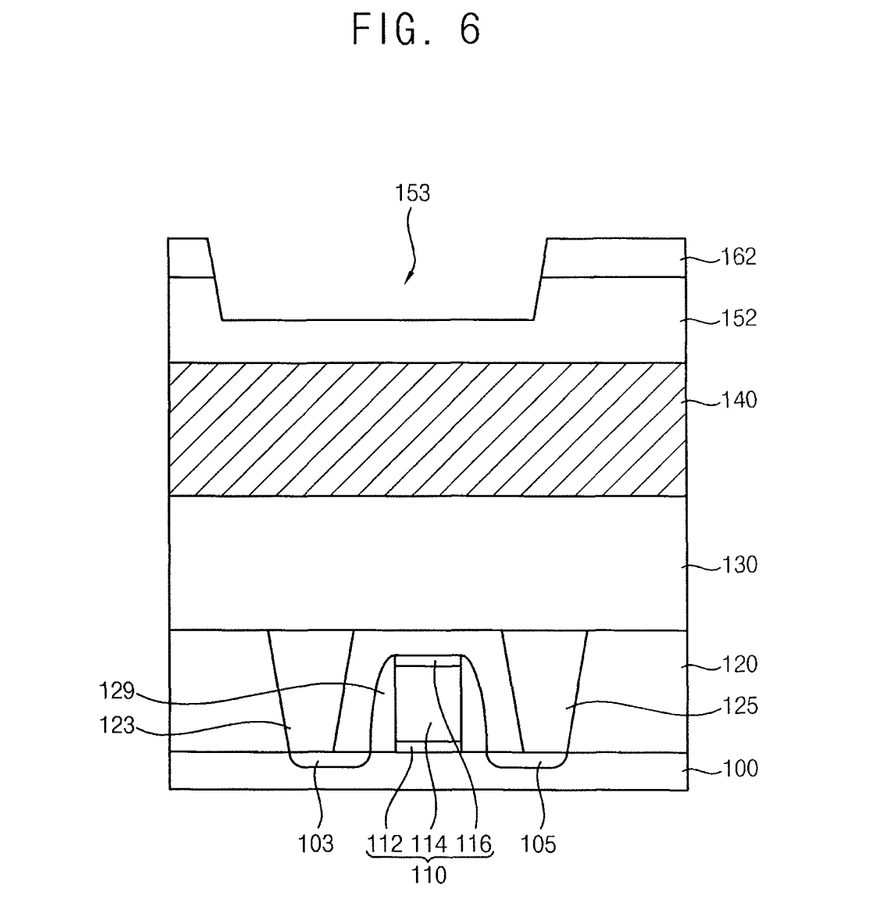

Referring to FIG. 6, the exposed portion of the second layer 150 may be etched using the first preliminary mask 162 as an etch mask to form a second preliminary layer pattern 152. The second mask 172 may be removed.

The second layer 150 may be slowly etched such that a depth of the second layer 150 in the etching process is easily controlled even if the thickness of the second layer 150 is small. A first recess 153 may be formed in the second preliminary layer pattern 152 and the first preliminary mask 162. The first recess 153 may not expose a portion of the first layer 140 under the second preliminary layer pattern 152.

A bottom surface of the first recess 153 may be formed in the second preliminary layer pattern 152. In an example embodiment, the bottom surface of the first recess 153 may be formed to be higher than a half of a height of the second preliminary layer pattern 152.

In example embodiments, the etching process may be performed by a wet etch process.

Figure 7:
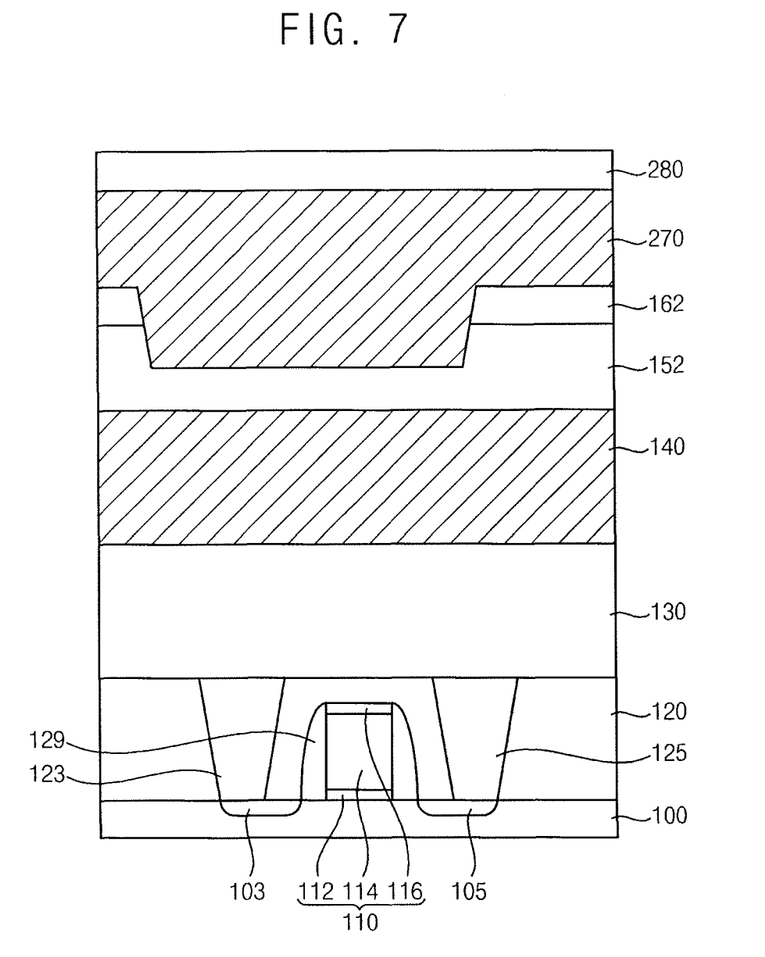

Referring to FIG. 7, a fourth mask layer 270 may be formed on a top surface of the first preliminary mask 162 and a sidewall and the bottom surface of the first recess 153. A fifth mask layer 280 may be formed on the fourth mask layer 270. The fourth and fifth mask layers 270 and 280 may serve as a second mask layer structure.

The fourth mask layer 270 may include substantially the same material as that of the second mask layer 170, e.g., SOH, ACL, etc. The fifth mask layer 280 may include substantially the same material as that of the third mask layer 180, e.g., silicon oxynitride.

Figure 8:
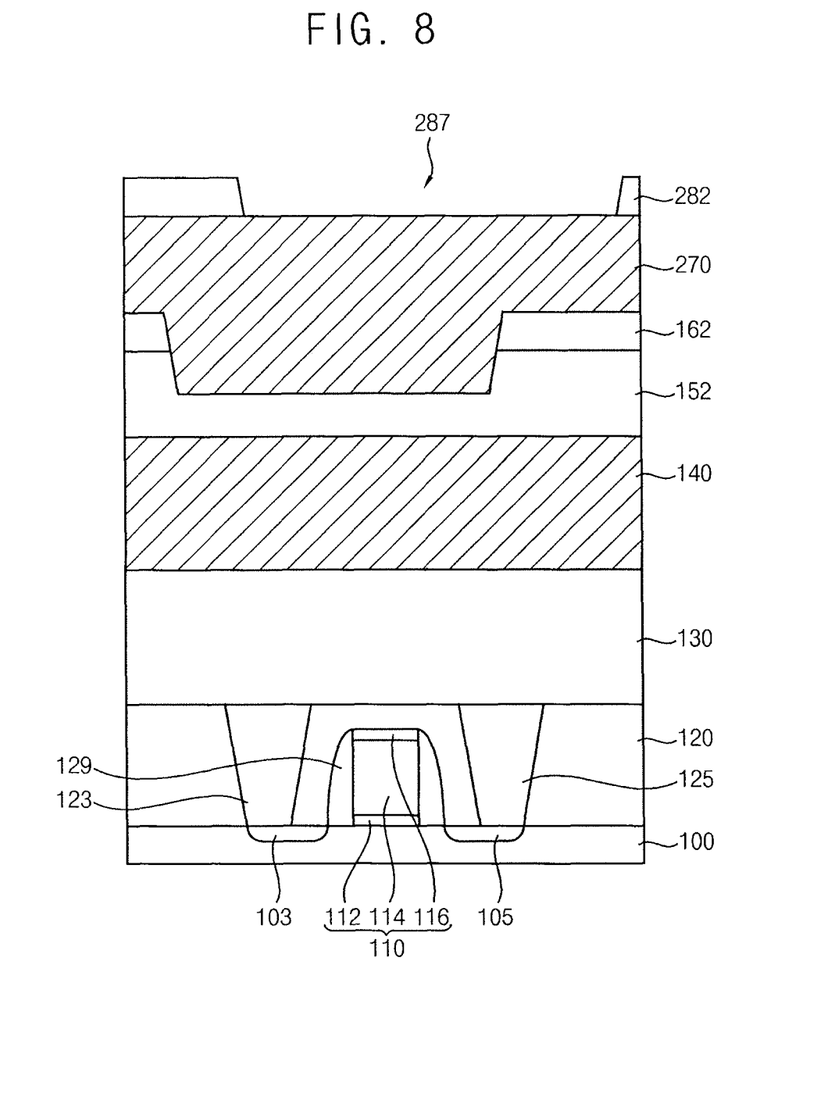

Referring to FIG. 8, a process substantially identical or similar to the process illustrated with reference to FIG. 3 may be performed, such that the fifth mask layer 280 is partially etched to form a fifth mask 282. The fifth mask 282 may be formed to have a fourth opening 287 vertically overlapping the second contact plug 125 and the gate structure 110 adjacent to the second contact plug 125. A portion of the fourth mask layer 270 may be exposed.

Figure 9:
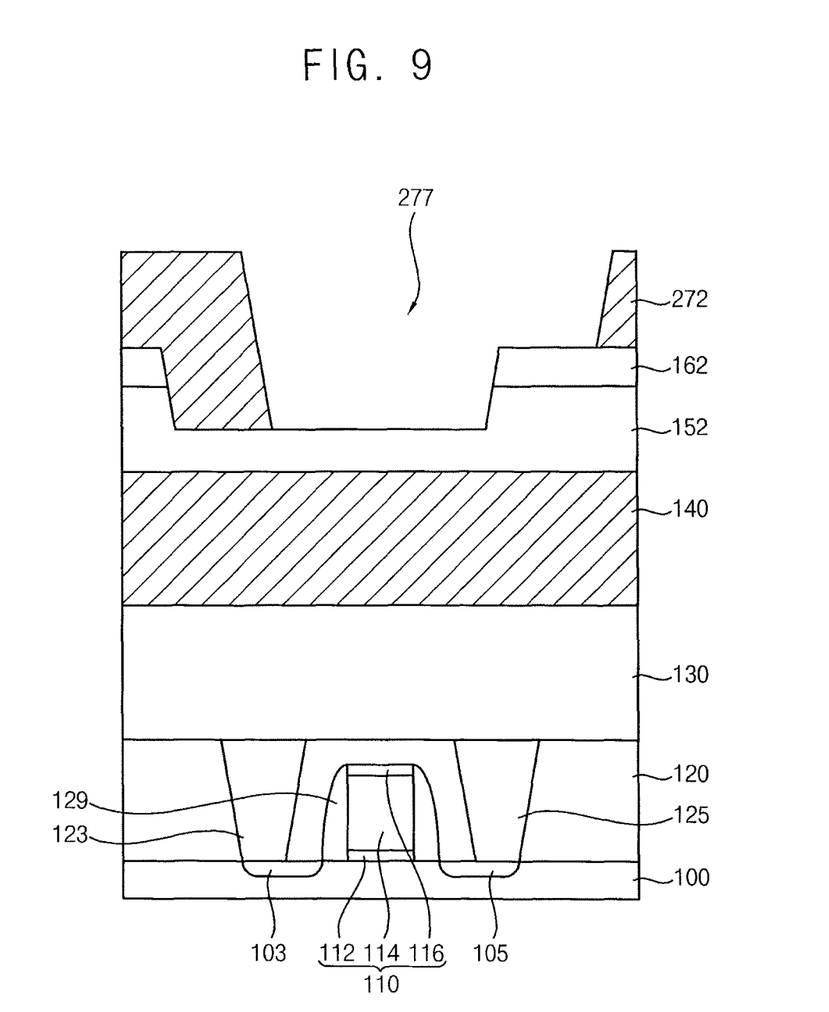

Referring to FIG. 9, a process substantially identical or similar to the process illustrated with reference to FIG. 4 may be performed such that the fourth mask layer 270 is partially etched to form a fourth mask 272. The fourth mask 272 may be formed to have an fifth opening 277 exposing a portion of the first preliminary mask 162 and a portion of the preliminary second layer pattern 152. In the etching process, the fifth mask 282 may be removed.

The fifth opening 277 may be formed to vertically overlap the second contact plug 125 and the gate structure 110 adjacent thereto.

Figure 10:
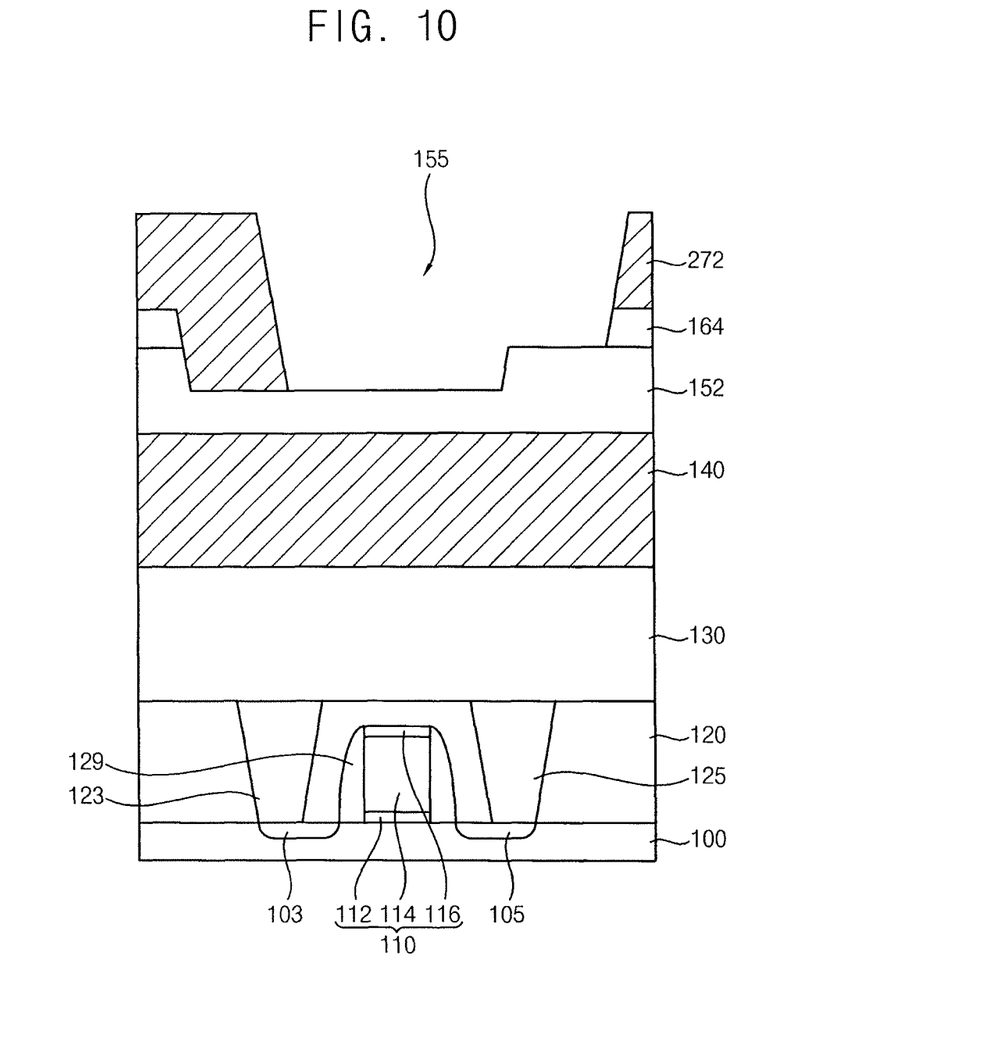

Referring to FIG. 10, a process substantially identical or similar to the process illustrated with reference to FIG. 5 may be performed such that the first preliminary mask 162 is etched to form a first mask 164 having a sixth opening 155 that exposes a portion the second preliminary layer pattern 152. The portion of the second preliminary layer pattern 152 exposed by the sixth opening 155 may be greater than the portion exposed by the fifth opening 277.

The sixth opening 155 may be formed to overlap the second contact plug 125 and the gate structure 110 adjacent to the second contact plug 125, similar to the fifth opening 277. The exposed portion of the second preliminary layer pattern 152 by the sixth opening 155 may have a shape of a staircase. For example, the exposed portion of the second preliminary layer pattern 152 may have a tiered shape.

Figure 11:
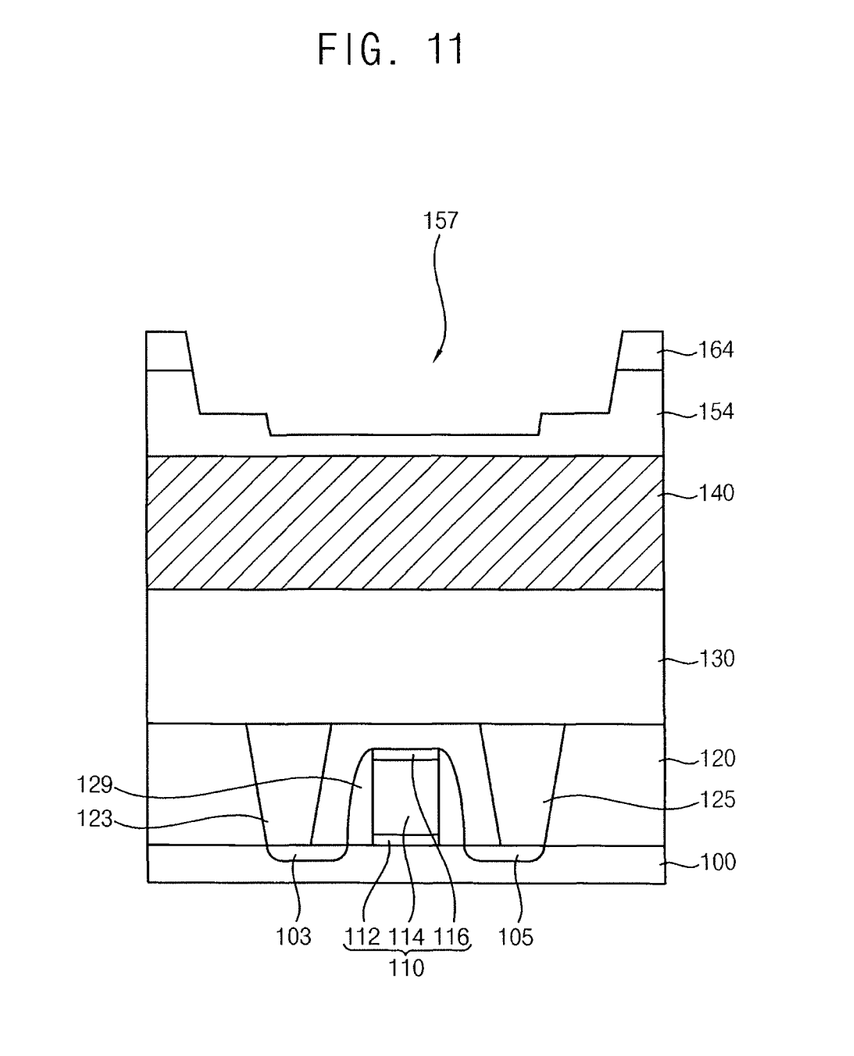

Referring to FIG. 11, the second preliminary layer pattern 152 may be partially etched using the fourth mask 272 as an etch mask to form a second layer pattern 154. The fifth mask 272 may be removed.

The second layer pattern 154 and the first mask 164 may be formed to have a second recess 157 having a shape of a staircase, for example, a tiered shape. A center portion of the second recess 157 may be formed to be lower than edge portions of the second recess 157. A bottom surface of the second recess 157 may be formed to be in the second layer pattern 154.

Figure 12:
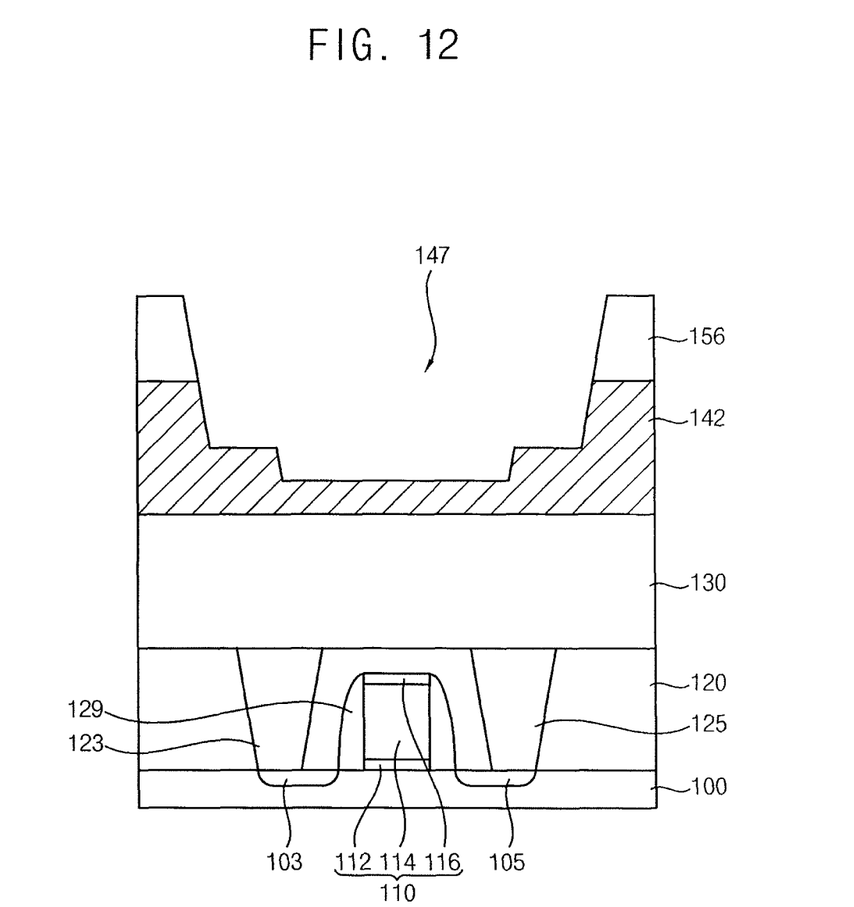

Referring to FIG. 12, a portion of the second layer pattern 154 under the second recess 157 may be etched using the first mask 164 as an etch mask until a top surface of the first layer 140 is exposed.

The second recess 157 may have the shape of staircase such that the edge portions of the second layer pattern 154 remain. The etching process may be performed until the entire second layer pattern 154 under the second recess 157 is removed.

The first layer 140 under the second layer pattern 154 may be softer than the second layer pattern 154 such that the first layer 140 may be rapidly etched. However, the first layer 140 may be formed to have the thickness greater than that of the second layer pattern 154 such that a portion of the second insulating interlayer 130 under the first layer 140 is exposed until the entire second layer pattern 154 is removed. In the etching process, the shape of the second recess 157 in the second layer pattern 154 may be transcribed into the first layer 140 to form a first preliminary layer pattern 142.

In the etching process, a portion of the second layer pattern 154 may remain to form a sixth mask 156. The first preliminary layer pattern 142 and the sixth mask 156 may have a third recess 147 having a shape of a staircase, for example, a tiered shape. A bottom surface of the third recess 147 may be formed in the first preliminary layer pattern 142.

Figure 13:
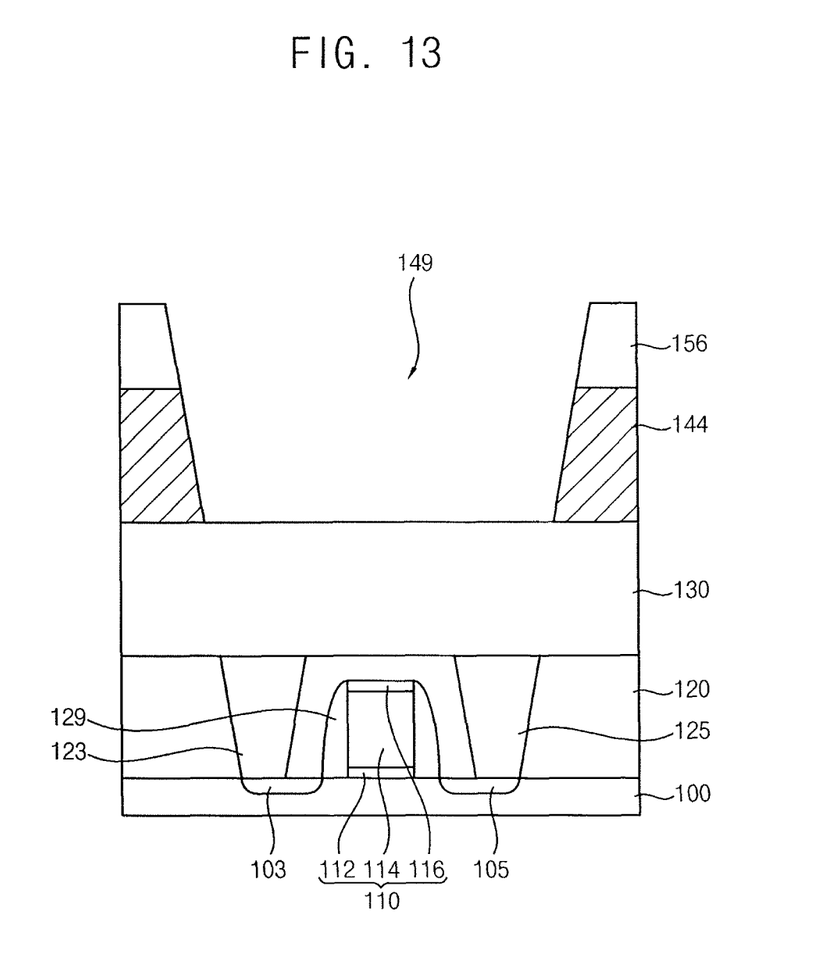

Referring to FIG. 13, a portion of the first preliminary layer pattern 142 under the third recess 147 may be etched using the sixth mask 156 as an etch mask to form a first layer pattern 144.

The etching process may be performed until a top surface of the second insulating interlayer 130 is exposed. The second insulating interlayer 130 may have a high etch selectivity with respect to the first preliminary layer pattern 142. Thus, the shape of the third recess 147 may not be transcribed into the second insulating interlayer 130, and the second insulating interlayer 130 may be formed to have a flat top surface. A seventh opening 149 in the sixth mask 156 and the first layer pattern 144 may be formed to expose a top surface of the first insulating interlayer 120.

Figure 14:
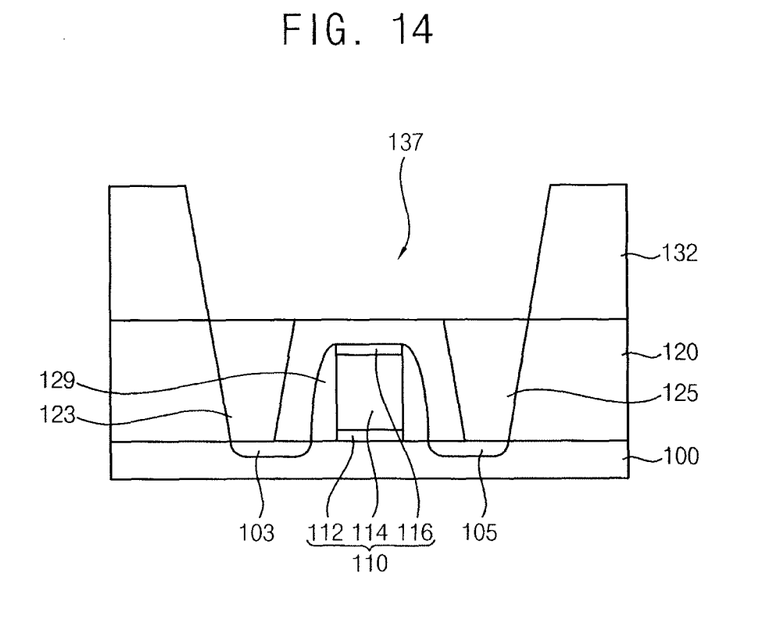

Referring to FIG. 14, the second insulating interlayer 130 may be etched using the sixth mask 156 and the first layer pattern 144 as an etch mask to form a second insulating interlayer pattern 132. The sixth mask 156 and the first layer pattern 144 may be removed.

An eighth opening 137 may be formed in the second insulating interlayer pattern 132 to expose the first and second contact plugs 123 and 125 and a portion of the first insulating interlayer 120 therebetween.

Figure 15:
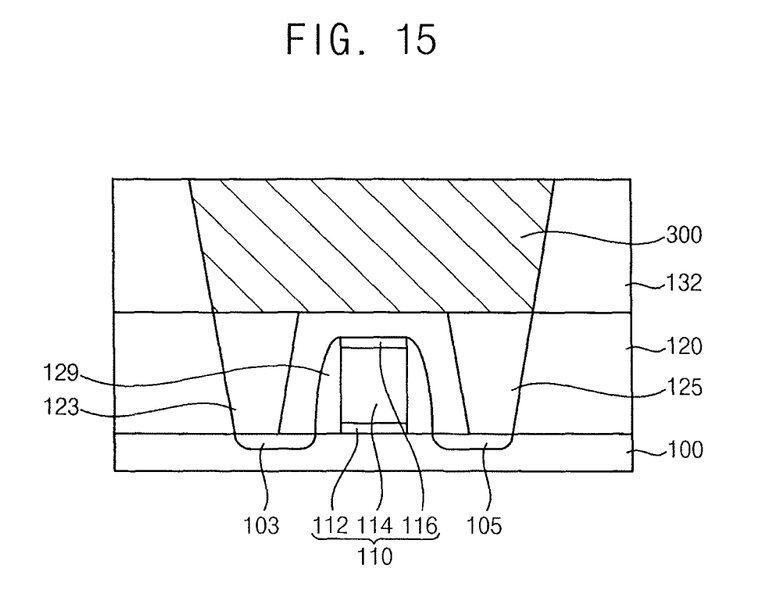

Referring to FIG. 15, a wiring 300 may be formed to fill the eighth opening 137, and contact the first and second contact plugs 123 and 125.

For example, a conductive layer may be formed on the first and second contact plugs 123 and 125, the first insulating interlayer 120 and the second insulating interlayer pattern 132 to sufficiently fill the eighth opening 137. The conductive layer may be planarized to expose a top surface of the second insulating interlayer pattern 132 such that the wiring 330 may be formed. The conductive layer may include, for example, doped polysilicon, a metal, etc. The planarization process may be performed by an etch back process and/or a CMP process.

In example embodiments, when the wiring 300 is formed in the second insulating interlayer 300 to contact both of the first and second contact plugs 123 and 125, the third and fifth openings 165 and 157 may be formed to vertically overlap the first and second contact plugs 123 and 125 in the second layer 150, respectively, and a portion between the first and second contact plugs 123 and 125 in the second layer 150 may be etched twice so that the second layer pattern 154 may be formed to have the second recess 157 having a shape of staircase. The second layer pattern 154 may be sufficiently etched so that the shape of the second recess 157 may be transcribed into the first layer 140 under the second layer pattern 154. The first layer pattern 144 may be formed to have the third recess 147, which may have a shape substantially the same as that of the second layer pattern 154. In the etching process of the first layer pattern 144, however, the second insulating interlayer 130 under the first layer pattern 144 may have a high etch selectivity with respect to the first layer pattern 144, and thus, the shape of the third recess 147 may not be transcribed into the second insulating interlayer 130.

The shape of the second recess 157 in the second layer pattern 154 may be transcribed into the first preliminary layer pattern 142 under the second layer pattern 154 to form the third recess 147. However, the shape of the second recess 157 may not be transcribed into the second insulating interlayer 130 under the first layer pattern 144. The first preliminary layer pattern 142 between the second layer pattern 154 and the second insulating interlayer 130 may serve as a buffer that prevents a transcription of the shape of the second recess 157 into the second insulating interlayer 130. The first insulating interlayer 120 under the second insulating interlayer 130 may not be etched when the second insulating interlayer 130 is etched to form the eighth opening 137. The eighth opening 137 may not expose the gate structure 100, and a wiring 300 that fills the eighth opening 137 may be formed only in the second insulating interlayer pattern 132 and may not contact the gate structure 110. Accordingly, an electrical short between the contact plugs 123 and 125 and the gate structure 110 in the first insulating interlayer 120 may be prevented.

By way of summation and review, a process of forming a semiconductor device has become more difficult as the integration of semiconductor devices increases. For example, in a process of forming a wiring contacting both of two contact plugs through an insulating interlayer, a recess may be undesirably formed between the contact plugs in the insulating interlayer. When the wiring is formed on the insulating interlayer including in the recess, an electrical short may occur between the contact plugs and a semiconductor device located under the recess between the contact plugs.

In example embodiments, a wiring may be formed by a process that includes, for example sequentially forming a first layer including a material such as a silicon on hardmask (SOH) and a second layer including a material such as silicon oxide on an insulating interlayer. The second layer may be etched to overlap first and second contact plugs, respectively, so that a second layer pattern and a recess having a shape of staircase therein may be formed. Then, when the second layer pattern is etched, the recess may be transcribed into a first layer pattern under the second layer pattern. When the entire first layer pattern is etched, however, a shape of the recess may not be transcribed into the insulating interlayer under the first layer pattern because the first layer pattern may have a high etch selectivity with respect to the insulating interlayer. The opening formed thereby may not expose a semiconductor device such as a gate structure formed in the insulating interlayer. Therefore, the wiring may be formed only in the insulating interlayer, and an electrical short may not occur between the contact plugs and the gate structure.

According to example embodiments, a semiconductor device may be formed to include a contact plug connecting at least two conductive regions in order to improve an integration of the semiconductor device. When a first layer is used in a process of forming the contact plug, a recess may not be formed between the conductive regions, and thus, defects of the semiconductor device may be reduced. Therefore, the semiconductor device may be highly integrated, and have good electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing a wiring, the method comprising:
sequentially forming a first insulation layer, a first layer, and a second layer on a substrate;
etching an upper portion of the second layer a plurality of times to form a second layer pattern including a first recess having a shape of a staircase in which a center portion is relatively low;
etching a portion of the second layer pattern and a portion of the first layer under the first recess to form a first layer pattern including a second recess having a shape of a staircase similar to that of the first recess;
etching a portion of the first layer pattern under the second recess until a top surface of the first insulation layer is exposed to form a first opening exposing a portion of the first insulation layer;
etching the exposed portion of the first insulation layer to form a second opening through the first insulation layer; and
forming a wiring filling the second opening.

2. The method as claimed in claim 1, wherein:
the first layer is formed to have a thickness greater than that of the second layer, and
the first layer is formed using a material having an etch rate higher than that of the second layer.

3. The method as claimed in claim 2, wherein:
the first layer is formed to include a spin on hardmask, and
the second layer is formed of an oxide by an atomic layer deposition process.

4. The method as claimed in claim 1, wherein the first layer is formed to include a material having a high etch selectivity with respect to the first insulation layer.

5. The method as claimed in claim 4, wherein:
the first layer is formed to include a spin on hardmask, and
the first insulation layer is formed to include silicon oxide.

6. The method as claimed in claim 1, further comprising, before forming the first insulation layer and the first and second layers:
forming an insulating interlayer on the substrate; and
forming a first contact plug and a second contact plug through the insulating interlayer on the substrate,
wherein the wiring is formed to contact top surfaces of the first and second contact plugs.

7. The method as claimed in claim 6, wherein forming the second layer pattern includes:
etching the second layer twice to form the second layer pattern including the first recess having the shape of a staircase,
wherein a portion of the first recess vertically overlapping a portion of the insulating interlayer between the first and second contact plugs is formed to be lower than a portion of the first recess vertically overlapping the first contact plug or the second contact plug.

8. The method as claimed in claim 7, wherein forming the second layer pattern includes:
etching a portion of the second layer vertically overlapping the first contact plug and a portion of the second layer vertically overlapping a portion of the insulating interlayer between the first and second contact plugs; and
etching a portion of the second layer vertically overlapping the second contact plug and an additional portion of the second layer vertically overlapping a portion of the insulating interlayer between the first and second contact plugs.

9. The method as claimed in claim 1, wherein etching the upper portion of the second layer the plurality of times to form the second layer pattern includes:
forming a first mask layer structure on the second layer;
partially etching the first mask layer structure; and
performing a first etching process on the second layer using the etched first mask layer structure.

10. The method as claimed in claim 9, wherein forming the first mask layer structure includes sequentially forming first to third mask layers on the second layer.

11. The method as claimed in claim 10, wherein the first to third mask layers respectively include silicon nitride, spin on hardmask and silicon oxynitride.

12. The method as claimed in claim 9, wherein etching the upper portion of the second layer the plurality of times to form the second layer pattern further includes, after performing the first etching process on the second layer, performing a second mask layer etching process on the second layer using a second mask layer structure.

13. The method as claimed in claim 12, wherein the second mask layer structure includes a fourth mask including a silicon hardmask and a fifth mask including silicon oxynitride.

14. The method as claimed in claim 1, wherein forming the first opening includes removing a portion of the second layer pattern under the second recess.

15. The method as claimed in claim 1, wherein etching the upper portion of the second layer a plurality of times includes performing a wet etch process.

16. A method of manufacturing a wiring, the method comprising:

providing a gate structure on a substrate, providing an insulating interlayer covering the gate structure, and providing a first contact plug and a second contact plug extending through the insulating interlayer and contacting first and second impurity regions in the substrate adjacent to the gate structure, the first and second contact plugs being exposed at a top surface of the insulating interlayer, sequentially forming a first insulation layer, a first layer, and a second layer on the top surface of the insulating interlayer, the first layer having a higher etch rate than the second layer and having a high etch selectivity with respect to the first insulation layer;

etching an upper portion of the second layer a plurality of times to form a second layer pattern including a first recess having a tiered shape such that a portion of the first recess vertically overlapping a portion of the insulating interlayer between the first and second contact plugs is lower than a portion of the first recess vertically overlapping the first contact plug or the second contact plug;

etching a portion of the second layer pattern and a portion of the first layer under the first recess to form a first layer pattern including a second recess having a tiered shape such that a portion of the second recess vertically overlapping a portion of the insulating interlayer between the first and second contact plugs is lower than a portion of the second recess vertically overlapping the first contact plug or the second contact plug;

etching a portion of the first layer pattern under the second recess to form a first opening exposing a portion of the first insulation layer;

etching the exposed portion of the first insulation layer to form a second opening exposing the top surface of the insulating interlayer and the first and second contact plugs and not exposing the gate structure; and forming a wiring filling the second opening, the wiring contacting top surfaces of the first and second contact plugs and being insulated from the gate structure.

17. The method as claimed in claim 16, wherein the first layer has a thickness greater than that of the second layer.

18. The method as claimed in claim 16, wherein:
the first layer is a spin on hardmask or an amorphous carbon layer, and
the second layer includes an insulating material including an oxide by an atomic layer deposition process.

19. The method as claimed in claim 16, wherein:
the first layer is a spin on hardmask, and
the first insulating layer is formed of silicon oxide.

20. The method as claimed in claim 16, wherein etching the upper portion of the second layer a plurality of times includes performing a wet etch process.

* * * * *